(12) United States Patent
Takenaka

(10) Patent No.: US 6,281,513 B1
(45) Date of Patent: Aug. 28, 2001

(54) PATTERN FORMING METHOD

(75) Inventor: Hiroshi Takenaka, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/327,468

(22) Filed: Jun. 8, 1999

(30) Foreign Application Priority Data

Jun. 12, 1998 (JP) ................................... 10-164923
Sep. 9, 1998 (JP) ................................... 10-254827

(51) Int. Cl.[7] ..................................................... G03F 9/00
(52) U.S. Cl. ................... 250/492.22; 250/492.2; 250/492.3; 430/5; 430/296
(58) Field of Search ........................... 250/492.22, 492.2, 250/492.3; 430/5, 296

(56) References Cited

U.S. PATENT DOCUMENTS

| 5,888,682 | * | 3/1999 | Nakasuji | ................................ | 430/22 |
| 6,017,658 | * | 1/2000 | Rhee et al. | ................................ | 430/5 |
| 6,035,113 | * | 3/2000 | Gerber et al. | ....................... | 395/500.2 |

FOREIGN PATENT DOCUMENTS

| 58-61628 | 4/1983 | (JP) . |
| 58-63135 | 4/1983 | (JP) . |
| 63-58829 | 3/1988 | (JP) . |
| 7-94376  | 4/1995 | (JP) . |
| 8-55775  | 2/1996 | (JP) . |
| 8-64499  | 3/1996 | (JP) . |

OTHER PUBLICATIONS

F. Murai et al., "Fast proximity effect correction method using a pattern area density map", Proc. of J. Vac. Sci. Technol. B 10(6), Nov./Dec. 1992, pp. 3072–3076.

* cited by examiner

Primary Examiner—Bruce Anderson
Assistant Examiner—Nikita Wells
(74) Attorney, Agent, or Firm—Eric J. Robinson; Nixon Peabody LLP

(57) ABSTRACT

Forward-scatter energy $E_f$, deposited at the center of an electron beam focused on a resist film out of energy of a forward-scattered electron, is derived. A first exposure dose $D_f$ is also obtained as a minimum exposure dose at which one of lines of a testing resist film starts to leave the center thereof when the testing resist film is developed after the lines have been irradiated with the electron beam with the exposure dose thereof varied. In this case, the resist film for forming a pattern thereon is a negative resist, and has the same composition and thickness as the testing resist film. A line-to-line distance between adjacent ones of the lines gradually increases from a value equal to or smaller than twice the length of a backscattering radius $\beta_b$ to a value more than twice the length of a maximum radius $r_b$ of backscattered electron's reach. And a function $D(s)$ of a second exposure dose is obtained using the line-to-line distance as a variable. The second exposure dose is a minimum exposure dose, at which one of spaces between the lines of the testing resist film starts to leave the center thereof. An intensity distribution of energy deposited in a region of the resist film, which is outside of the backscattered electron's reach, is obtained around the center of the focused electron beam by $(D_f/D(s)) \times E_f$, and used for proximity effect correction.

13 Claims, 7 Drawing Sheets

Distance from a point
an electron enters

PATTERN FORMING METHOD

BACKGROUND OF THE INVENTION

The present invention relates to a method for forming a pattern by electron-beam lithography.

In electron-beam lithography, an electron beam is irradiated at a high velocity onto a resist film, which is formed on a substrate and is highly sensitive to the electron beam, thereby writing or transferring a desired pattern onto the resist film.

According to electron-beam lithography, a pattern with a line width of 0.1 μm or less can be written at a high resolution, and a plurality of patterns can be aligned with, and overlaid on, each other very accurately. Thus, electron-beam lithography has been applied to various sorts of fine-line processing to form patterns for a photomask, interconnection for a semiconductor device, and so on.

During an electron-beam lithography process, electrons, which have impinged onto a resist film formed on a substrate, collide against numerous atoms with a smaller atomic weight (e.g., carbon atoms) making up the resist film to scatter forward. In addition, after the electrons have passed through the resist film and entered the substrate, the electrons also collide against numerous atoms with a larger atomic weight (e.g., silicon atoms) making up the substrate to scatter backward. As a result, so-called "proximity effects" are caused. Specifically, not only a target region of the resist film, on which the electron beam should be incident, but also surrounding regions thereof are unintentionally exposed due to the electrons that have scattered forward and/or backward, thus degrading the resulting pattern accuracy.

Thus, to improve the resultant pattern accuracy in the electron-beam lithography, proximity effect correction is indispensable. That is to say, before a resist film is irradiated with an electron beam, the exposure dose of the electron beam should be controlled in view of the proximity effects.

Hereinafter, the forward and backward scattering of electrons and a conventional method for compensating for the proximity effects as disclosed in J. Appl. Phys., Vol. 50, No. 6, June 1979, pp. 4371–4387 will be described with reference to FIGS. 5(a) and 5(b).

FIG. 5(a) illustrates an exemplary trajectory of an electron 3, which scatters forward within a resist film 2 and then backward within a substrate 1.

As shown in FIG. 5(a), first, the electron 3 scatters forward within the resist film 2 as indicated by a portion 4 of the trajectory (the lateral range 6 of which is defined from the point where the electron 3 enters the resist film 2). Then, the electron 3 scatters backward within the substrate 1 as indicated by another portion 5 of the trajectory (the lateral range 7 of which is also defined from the point where the electron 3 enters the resist film 2).

FIG. 5(b) illustrates Gaussian distributions representing exemplary distributions of the lateral ranges 6 and 7 of the electron 3 scattering forward and backward, respectively.

As shown in FIG. 5(b), the distribution of the lateral range 6 of the forward-scattered electron is represented as a first Gaussian distribution 8 with a standard deviation $\beta_f$ (which will herein be called a "forward-scattering radius"), while the distribution of the lateral range 7 of the backscattered electron is represented as a second Gaussian distribution 9 with a standard deviation $\beta_b$ (which will herein be called a "backscattering radius"). Also, the lateral range 7 of the backscattered electron is defined by a maximum radius $r_b$ that the backscattered electron can possibly reach (in this specification, this radius will be called a "maximum radius $r_b$ of backscattered electron's reach"). In other words, the backscattered electron never goes beyond the limit defined by the maximum radius $r_b$, which is the longest distance as measured from the point where the electron 3 enters the resist film 2.

The forward-scattering radius $\beta_f$, backscattering radius $\beta_b$ and maximum radius $r_b$ differ depending on the accelerating voltage of an electron beam and the materials compositions of a substrate and a resist film. In an ordinary situation, where a silicon substrate and a resist film with a carbon skeleton are used and the resist film is irradiated with an electron beam at an accelerating voltage of 70 keV, the forward-scattering radius $\beta_f$, backscattering radius $\beta_b$ and maximum radius $r_b$ are about 0.05 μm, about 20 μm and about 35 μm, respectively.

When a resist film is irradiated with an electron beam, the respective energies of the forward- and backward-scattered electrons are absorbed into the resist film. Thus, the intensity distribution of energy deposited in the resist film about the center of the electron beam focused is the sum of first and second intensity distributions of energy deposited in the resist film by the forward- and backward-scattered electrons, respectively, around the center.

The first intensity distribution of energy deposited by the forward-scattered electron can be represented as the distribution of the lateral range of the forward-scattered electron and approximated to the first Gaussian distribution 8 with a standard deviation equal to the forward-scattering radius $\beta_f$ (see FIG. 5(b)). On the other hand, the second intensity distribution of energy deposited by the backscattered electron can be represented as the distribution of the lateral range of the backscattered electron and approximated to the second Gaussian distribution 9 with a standard deviation equal to the backscattering radius $\beta_b$ (see also FIG. 5(b)).

The intensity of energy deposited by the forward-scattered electron at the center of the electron beam focused on the resist film is several hundred times as high as that of energy deposited by the backscattered electron at the center of the electron beam focused on the resist film.

A conventional method for correcting the proximity effects includes the following process steps. First, the forward-scattering radius $\beta_f$, backscattering radius $\beta_b$ and first and second intensity distributions of energy deposited by the forward- and backward-scattered electrons are derived based on experiments, simulations or the like. Next, the first and second intensity distributions are approximated to the Gaussian distributions with the standard deviations equal to the forward-scattering radius $\beta_f$ and backscattering radius $\beta_b$, respectively. Subsequently, a function representing a sum of the first and second intensity distributions approximated and a function representing a predetermined exposure dose at an arbitrary position in the resist film (i.e., a function representing an exposure pattern) are convoluted to calculate total energy deposited at that arbitrary position. Then, the function representing an exposure pattern is modified so as to equalize the total energy deposited with a predetermined value. According to the conventional method, after the exposure dose of the electron beam has been controlled by this proximity effect correction technique, the resist film is irradiated with the electron beam at the controlled dose, thereby writing a desired pattern onto the resist film. Finally, the resist film, which has been irradiated with the electron beam, is developed, thereby selectively removing unnecessary portions of the resist film and defining a resist pattern.

To improve the accuracy of proximity effect correction, an intensity distribution of energy deposited by a secondary electron, which has been formed by the collision of the incoming electron against the atoms making up the substrate, is sometimes used. However, the secondary electron move at a relatively low velocity and the lateral range of the secondary electron is about several hundredths of the backscattering radius $\beta_b$. Thus, the accuracy of proximity effect correction cannot be greatly improved even by the use of the intensity distribution of energy deposited by the secondary electron.

Also, according to the majority of previous methods for compensating for the proximity effects, the convolution is employed just for the purpose of high-speed approximation. Furthermore, these methods suppose that the resist film is always exposed due to the forward- and backward-scattered electrons.

The conventional electron-beam lithography utilizing the proximity effect correction technique has been adopted where the accelerating voltage of the electron beam is less than 50 keV. In order to increase the resolution at the electron-beam lithography, however, the accelerating voltage of the electron beam should be 50 keV or more.

Nevertheless, in accordance with the conventional electron-beam lithography utilizing the proximity effect correction technique, if the accelerating voltage of the electron beam is defined at 50 keV or more, the accuracy of proximity effect correction declines with the increase in accelerating voltage. Thus, the resultant pattern accuracy also declines accordingly.

SUMMARY OF THE INVENTION

An object of the present invention is improving the accuracy of proximity effect correction and thereby forming a more accurate pattern by electron-beam lithography with the accelerating voltage defined at 50 keV or more.

The present inventors exposed a resist film to an electron beam using a line-and-space pattern shown in FIG. 6 to look into the reason why the accuracy of proximity effect correction or resulting pattern declines at an accelerating voltage of 50 keV or more in the conventional electron-beam lithography utilizing proximity effect correction.

As shown in FIG. 6, lines L are to be irradiated with an electron beam as indicated by hatching and a space between adjacent lines L is identified by S. As will be described in greater detail later, a line-to-line distance s between adjacent lines L can be expressed using a backscattering radius $\beta_b$ and a maximum radius $r_b$ of backscattered electron's reach, which both should be obtained beforehand by a conventional Monte Carlo simulation. See, for example, K. Murata, Electron Beam Interaction with Solids, pp. 311–329, SEM, Inc., AMF O'Hare (Chicago), Ill. 60666, U.S.A.

As shown in FIG. 6, a number n of regions $A_1$ through $A_n$, each having the same line-and-space pattern, are arranged vertically. A line-to-line distance s gradually increases rightward in such a manner as s=$2\beta_b$, $2(\beta_b+\Delta\beta_b)$, ..., and the last (right end) line-to-line distance s is set larger than twice the length of the radius $r_b$. All the lines L within the same region are irradiated with an electron beam at the same exposure dose, and the exposure doses are different from each other among these regions. Specifically, the exposure doses of the regions $A_1$, $A_2$, ..., $A_n$ are defined at $D_1$, $D_2$, ..., $D_n$, respectively. These exposure doses are defined to gradually increase on the descending order in accordance with an equation such as $D_n=D_0 e^{n\Delta D}$, $D_n=\alpha^n D_0$ or $D_n=D_0+n\Delta D$.

FIGS. 7(a) through 7(c) illustrate how the boundary of a range that a backscattered electron can reach moves in the resist film with a change in line-to-line distance s in the line-and-space pattern shown in FIG. 6. In this specification, this range will be called a "backscattered electron's reach". In FIGS. 7(a) through 7(c), each backscattered electron's reach is indicated by a bold line.

If the line-to-line distance s is smaller than twice the length of the maximum radius rb as shown in FIGS. 7(a) and 7(b), then adjacent backscattered electron's reaches overlap each other when the lines L are irradiated with an electron beam. Alternatively, if the line-to-line distance s is larger than twice the length of the maximum radius $r_b$ as shown in FIG. 7(c), then adjacent backscattered electron's reaches do not overlap each other when the lines L are irradiated with an electron beam. Thus, the center of the space S in the resist film is not exposed due to the backscattered electron. In other words, if the center of a space S in the resist film were exposed although the line-to-line distance s is larger than twice the length of the radius $r_b$, the exposure would have been caused by a third exposure source other than the forward- or backward-scattered electrons.

First, the present inventors irradiated only the lines L of a resist film, which was formed with the line-and-space pattern shown in FIG. 6 on a silicon substrate, with an electron beam at an accelerating voltage of 70 keV with the exposure dose thereof varied. The resist film was formed to be about 0.5 $\mu$m thick on the silicon substrate by applying a negative electron beam resist NEB-22 (name of a product manufactured by Sumitomo Chemical Co., Ltd.) with a threshold sensitivity of about 5 $\mu$C/cm$^2$ onto the silicon substrate.

Next, the resist film, which had been irradiated with the electron beam, was developed and the maximum line-to-line distance s, at which the center of a space S of the resist film started to be left, was measured and divided by two to obtain a maximum exposure radius $r_x$, which was about 70 $\mu$m. On the other hand, the radius of a region in the resist film, which was exposed only to the forward- or backward-scattered electron and is a target of the conventional proximity effect correction, was equal to the maximum radius $r_b$, i.e., about 35 $\mu$m.

That is to say, we found that in irradiating a resist film with an electron beam at a high accelerating voltage, the radius of a region of the resist film that was actually exposed to the beam was about twice as long as the maximum radius $r_b$.

Thus, to form a desired fine-line pattern by electron-beam lithography at a high accelerating voltage, the proximity effects should be corrected in view of the fact that a region of the resist film, which is outside of backscattered electron's reach, is also exposed to the third exposure source.

The present inventors carried out intensive research on that third exposure source. As a result, we found that the third exposure source would possibly include an X-ray created in a substrate by an electron entering the substrate. It will be briefly described why the X-ray is expected to be the third exposure source.

When an electron enters a substrate, atoms, making up the substrate, are excited by the electron to radiate a characteristic X-ray therefrom. Also, since the electron entering the substrate is scattered by the atomic nuclei of the atoms making up the substrate, a continuous X-ray is radiated from the electron scattered.

It is known that, however, to increase the resolution in an electron-beam lithography process, an electron beam should be accelerated at a higher voltage, but that the intensity of the X-ray increases with an increase in the accelerating voltage of the electron beam. See, for example, Eugene P. Bertim, Introduction to X-ray Spectrometric Analysis, Plenum Press.

Also, since an X-ray is more likely to pass through a substrate than an electron, the X-ray can easily reach a region of the resist film that is out of backscattered electron's reach. Furthermore, the higher the accelerating voltage of an electron beam, the smaller the collision cross section where a chemical reaction is caused by the interaction between the electrons and the atoms making up the resist film. As a result, the sensitivity of the resist film to the electron beam decreases. Accordingly, in using an electron beam at a high accelerating voltage, the effects of the exposure of the resist film to the X-ray are non-negligible. Nevertheless, since those effects were not taken into account by the conventional proximity effect correction method (where a resist film is supposed to be exposed only to the forward- and backward-scattered electrons), the accuracy of the conventional method would decline in such a case.

Also, to increase the throughput of an electron-beam lithography process, the sensitivity of a resist film should be higher. However, as the sensitivity of a resist film to an electron beam increases, the sensitivity thereof to an X-ray also increases. Accordingly, if a highly sensitive resist film is irradiated with an electron beam at a high accelerating voltage, then the accuracy of the conventional proximity effect correction technique would further decline.

The present invention was conceived based on these findings. Specifically, a first method for forming a pattern according to the present invention includes the steps of:

depositing a resist film on a film to be processed on a substrate; irradiating the resist film with an electron beam at an exposure dose controlled by proximity effect correction, thereby writing a pattern onto the resist film; and developing the resist film, which has been irradiated with the electron beam, thereby defining a resist pattern. The proximity effect correction is carried out by using: a first intensity distribution of energy deposited in the resist film out of energy of a forward-scattered electron caused in the resist film by the irradiation of the electron beam; a second intensity distribution of energy deposited in the resist film out of energy of a backscattered electron caused in the substrate by the irradiation of the electron beam; and a third intensity distribution of energy created by the irradiation of the electron beam and deposited in a region of the resist film, which is outside of a backscattered electron's reach. The first, second and third intensity distributions are all defined around the center of the electron beam focused.

In the first method, the proximity effects are corrected by using not only the first and second intensity distributions of energy deposited by the forward- and backward-scattered electrons, respectively, but also the third intensity distribution, which is particularly affected by the proximity effects when a highly sensitive resist film is irradiated with an electron beam at a high accelerating voltage. Accordingly, even when a highly sensitive resist film is irradiated with an electron beam at a high accelerating voltage, the accuracy of the proximity effect correction and the resultant pattern accuracy can be both improved.

In one embodiment of the present invention, the resist film may be a negative resist. The third intensity distribution is preferably given by $(D_f/D(s)) \times E_f$. $E_f$ is forward-scatter energy, which is deposited at the center of the electron beam focused on the resist film out of the energy of the forward-scattered electron caused in the resist film by the irradiation of the electron beam. $D_f$ is a first exposure dose, which is a minimum exposure dose at which one of a plurality of lines of a testing resist film starts to leave the center thereof when the testing resist film is developed after the lines have been irradiated with the electron beam with the exposure dose thereof varied. The testing resist film and the resist film have the same composition and thickness. A line-to-line distance between adjacent ones of the lines gradually increases from a value equal to or smaller than twice the length of a backscattering radius to a value more than twice the length of a maximum radius of backscattered electron's reach. The backscattering radius is a standard deviation of a Gaussian distribution representing a lateral range of the backscattered electron in the resist film. The maximum radius represents a limit of the lateral range of the backscattered electron. And $D(s)$ is a function representing a second exposure dose using the line-to-line distance as a variable. The second exposure dose is a minimum exposure dose, at which one of a plurality of spaces between the lines of the testing resist film starts to leave the center thereof.

In such an embodiment, the third intensity distribution can be derived accurately by using the testing resist film. Accordingly, the accuracy of proximity effect correction can be further improved.

In an alternate embodiment of the present invention, the resist film may be a positive resist. The third intensity distribution is preferably given by $(D_f/D(s)) \times E_f$. $E_f$ is forward-scatter energy, which is deposited at the center of the electron beam focused on the resist film out of the energy of the forward-scattered electron caused in the resist film by the irradiation of the electron beam. $D_f$ is a first exposure dose, which is a minimum exposure dose at which one of a plurality of lines of a testing resist film starts to disappear at the center thereof when the testing resist film is developed after the lines have been irradiated with the electron beam with the exposure dose thereof varied. The testing resist film and the resist film have the same composition and thickness. A line-to-line distance between adjacent ones of the lines gradually increases from a value equal to or smaller than twice the length of a backscattering radius to a value more than twice the length of a maximum radius of backscattered electron's reach. The backscattering radius is a standard deviation of a Gaussian distribution representing a lateral range of the backscattered electron in the resist film. The maximum radius represents a limit of the lateral range of the backscattered electron. And $D(s)$ is a function representing a second exposure dose using the line-to-line distance as a variable. The second exposure dose is a minimum exposure dose, at which one of a plurality of spaces between the lines of the testing resist film starts to disappear at the center thereof.

In such an embodiment, the third intensity distribution can be derived accurately by using the testing resist film. Accordingly, the accuracy of proximity effect correction can be further improved.

A second method for forming a pattern according to the present invention includes the steps of: depositing a resist film on a film to be processed on a substrate; irradiating the resist film with an electron beam at an exposure dose controlled by proximity effect correction, thereby writing a pattern onto the resist film; and developing the resist film, which has been irradiated with the electron beam, thereby defining a resist pattern. The proximity effect correction is carried out by using: a first intensity distribution of energy deposited in the resist film out of energy of a forward-scattered electron caused in the resist film by the irradiation of the electron beam; a second intensity distribution of energy deposited in the resist film out of energy of a backscattered electron caused in the substrate by the irradiation of the electron beam; and a third intensity distribution of energy deposited in a region of the resist film, which is outside of a backscattered electron's reach, out of energy of a third exposure source caused by the irradiation of the electron beam. The first, second and third intensity distributions are all defined around the center of the electron beam focused.

In the second method, the proximity effects are corrected by using not only the first and second intensity distributions of energy deposited by the forward- and backward-scattered electrons, respectively, but also the third intensity distribution of energy deposited by the third exposure source caused by the irradiation of the electron beam, which is particularly affected by the proximity effects when a highly sensitive resist film is irradiated with an electron beam at a high accelerating voltage. Accordingly, even when a highly sensitive resist film is irradiated with an electron beam at a high accelerating voltage, the accuracy of proximity effect correction and the resultant pattern accuracy can be both improved.

In one embodiment of the present invention, the third intensity distribution is preferably given by $\Sigma\{g(\lambda,)\times\exp(-R/a(\lambda))\times I(\lambda,\theta)/n\times\Delta\lambda\}$. $I(\lambda,\theta)$ is a function representing the intensity of an X-ray, which has been created in the substrate by the irradiation of the electron beam per unit current, using the wavelength and radiation angle of the X-ray as variables. n is the number of electrons contained in the electron beam per unit current, the number being measured as a reciprocal of elementary charge per unit time. $a(\lambda)$ is a function representing the transmittance of the X-ray with respect to the substrate using the wavelength of the X-ray as a variable. $g(\lambda)$ is a function representing a ratio of energy deposited in the resist film by the X-ray with a unit intensity using the wavelength of the X-ray as a variable. And R is a distance from a point where the X-ray is created to a point where the X-ray reaches the resist film.

In such an embodiment, the third intensity distribution can be derived by numerical computations without actually exposing a testing resist film to an electron beam. Accordingly, the proximity effects can be corrected easily.

In an embodiment of the first and second methods, the proximity effect correction is preferably carried out by using not only the first, second and third intensity distributions, but also a fourth intensity distribution of energy deposited in the resist film out of energy of a secondary electron caused in the resist film and the substrate by the irradiation of the electron beam. The fourth intensity distribution is also defined around the center of the electron beam focused.

In such an embodiment, the pattern accuracy can be further improved.

A third method for forming a pattern according to the present invention includes the steps of: a) depositing a resist film on a film to be processed on a substrate; b) detecting an alignment mark formed on the substrate by scanning an electron beam; c) irradiating the resist film with the electron beam, thereby writing a pattern onto the resist film; and d) developing the resist film, which has been irradiated with the electron beam, thereby defining a resist pattern. The step c) includes writing the pattern only in a region of the resist film outside of a target region thereof exposed to the electron beam while the electron beam is being scanned in the step b).

In the third method, the pattern is written only in a region of the resist film outside of the target region thereof in the step c). Accordingly, it is possible to prevent the pattern accuracy from being degraded by the electron beam scanning in the step b).

A fourth method for forming a pattern according to the present invention includes the steps of: a) depositing a resist film on a film to be processed on a substrate; b) detecting an alignment mark formed on the substrate by scanning an electron beam; c) irradiating the resist film with the electron beam, thereby writing a pattern onto the resist film; and d) developing the resist film, which has been irradiated with the electron beam, thereby defining a resist pattern. The step c) includes setting an exposure dose, at which a target region of the resist film is irradiated with the electron beam, smaller than an exposure dose, at which another region of the resist film outside of the target region is irradiated with the electron beam while the electron beam is being scanned in the step b).

In the fourth method, an exposure dose, at which the target region is irradiated with the electron beam, is set smaller than an exposure dose, at which another region thereof outside of the target region is irradiated with the electron beam, in the step c). Accordingly, the total energy deposited by the electron beam in the target region can be approximately equalized with the total energy deposited by the electron beam in that region outside of the target region. Thus, the pattern accuracy in the target region can be substantially equalized with that in the region outside of the target region.

In an embodiment of the third and fourth methods, the resist film may be a negative resist. In the target region, a distance from a position at which the electron beam is scanned in the step b) is preferably within a maximum exposure radius. The maximum exposure radius is one half of a maximum line-to-line distance, at which one of a plurality of spaces between lines of a testing resist film starts to leave the center thereof when the testing resist film is developed after the lines have been irradiated with the electron beam with the exposure dose thereof varied. The line-to-line distance between adjacent ones of the lines gradually increases from a value equal to or smaller than twice the length of a backscattering radius to a value more than twice the length of a maximum radius of backscattered electron's reach. The backscattering radius is a standard deviation of a Gaussian distribution representing a lateral range of the backscattered electron in the resist film. The maximum radius of backscattered electron's reach represents a limit of the lateral range of the backscattered electron. The testing resist film and the resist film have the same composition and thickness.

In such an embodiment, the maximum exposure radius can be derived accurately by using the testing resist film. Accordingly, the target region can be defined accurately.

In an alternate embodiment of the third and fourth methods, the resist film may be a positive resist. In the target region, a distance from a position at which the electron beam is scanned in the step b) is preferably within a maximum exposure radius. The maximum exposure radius is one half of a maximum line-to-line distance, at which one of a plurality of spaces between lines of a testing resist film starts to disappear at the center thereof when the testing resist film is developed after the lines have been irradiated with the electron beam with the exposure dose thereof varied. The line-to-line distance between adjacent ones of the lines gradually increases from a value equal to or smaller than twice the length of a backscattering radius to a value more than twice the length of a maximum radius of backscattered electron's reach. The backscattering radius is a standard deviation of a Gaussian distribution representing a lateral range of the backscattered electron in the resist film. The maximum radius of backscattered electron's reach represents a limit of the lateral range of the backscattered electron. The testing resist film and the resist film have the same composition and thickness.

In such an embodiment, the maximum exposure radius can be derived accurately by using the testing resist film. Accordingly, the target region can be defined accurately.

BRIEF DESCRIPTION OF THE DRAWINGS

FIG. 5($b$) is a graph illustrating Gaussian distributions representing respective distributions of lateral ranges of the forward- and backward-scattered electrons.

DESCRIPTION OF THE PREFERRED EMBODIMENTS

EMBODIMENT 1

Hereinafter, a method for forming a pattern by electron-beam lithography according to a first exemplary embodiment of the present invention will be described with reference to the accompanying drawings. In the first embodiment, a testing resist film with the same composition and thickness as a resist film, on which a pattern should be formed, is irradiated with an electron beam, thereby obtaining the intensity distribution of energy deposited by the third exposure source in a region of the testing resist film, which is out of back-scattered electron's reach (where the intensity distribution is defined around the center of the electron beam focused). And the resultant intensity distribution is utilized for proximity effect correction.

First, in accordance with known experiments, simulations and so on, the backscattering radius $\beta_b$, maximum radius $r_b$ of backscattered electron's reach and forward-scatter energy $E_f$, which is deposited by the forward-scattered electron at the center of the electron beam focused on the resist film, are derived. In addition, first and second intensity distributions of energy deposited in the resist film by the forward- and backward-scattered electrons, respectively, around the center of the electron beam focused are also obtained.

Figure 6:
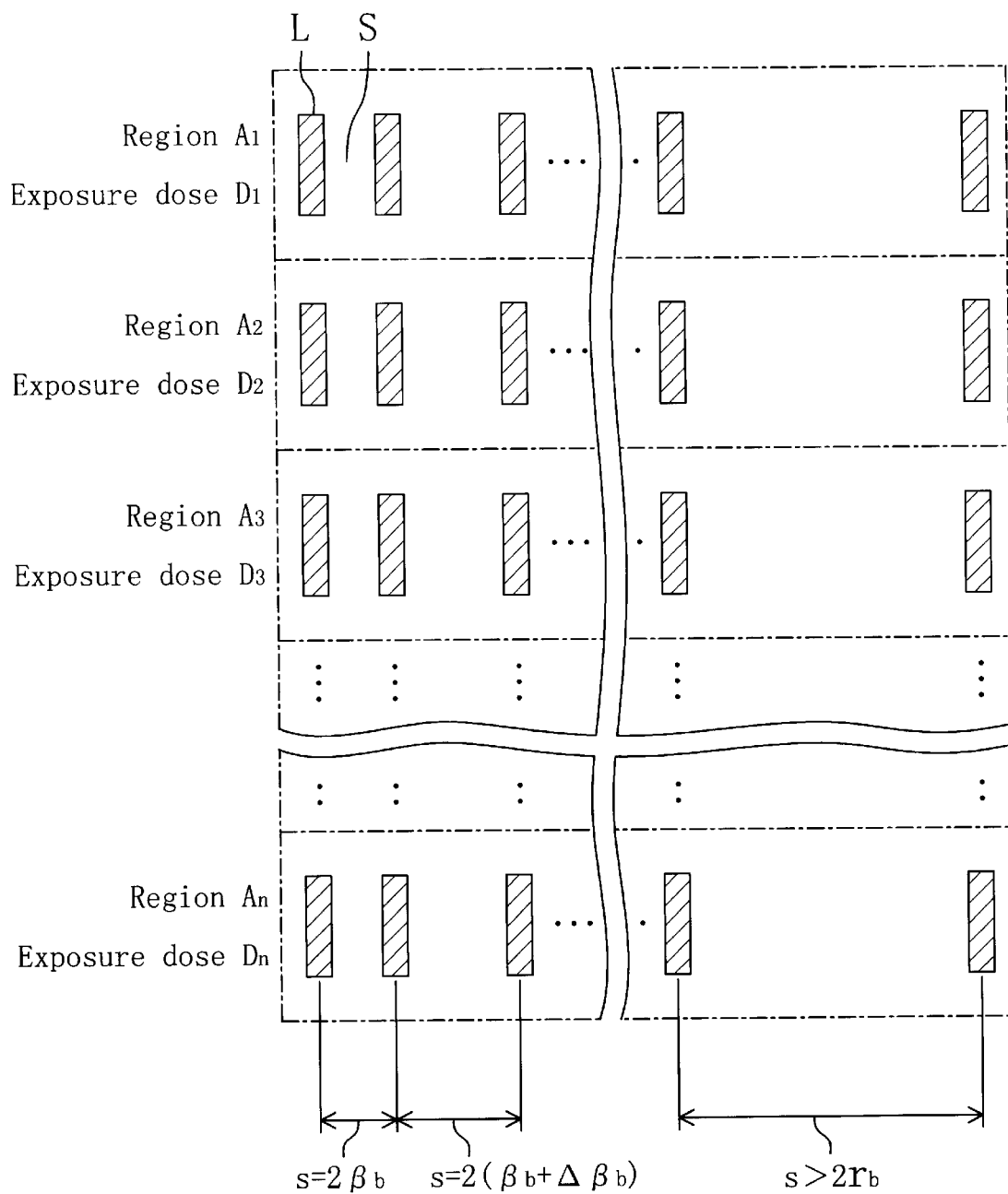
FIG. 6 illustrates a line-and-space pattern used for determining the intensity distribution of energy created upon the exposure to an electron beam and deposited in a region of a resist film that is out of backscattered electron's reach.
Figures 7A, 7B, 7C:
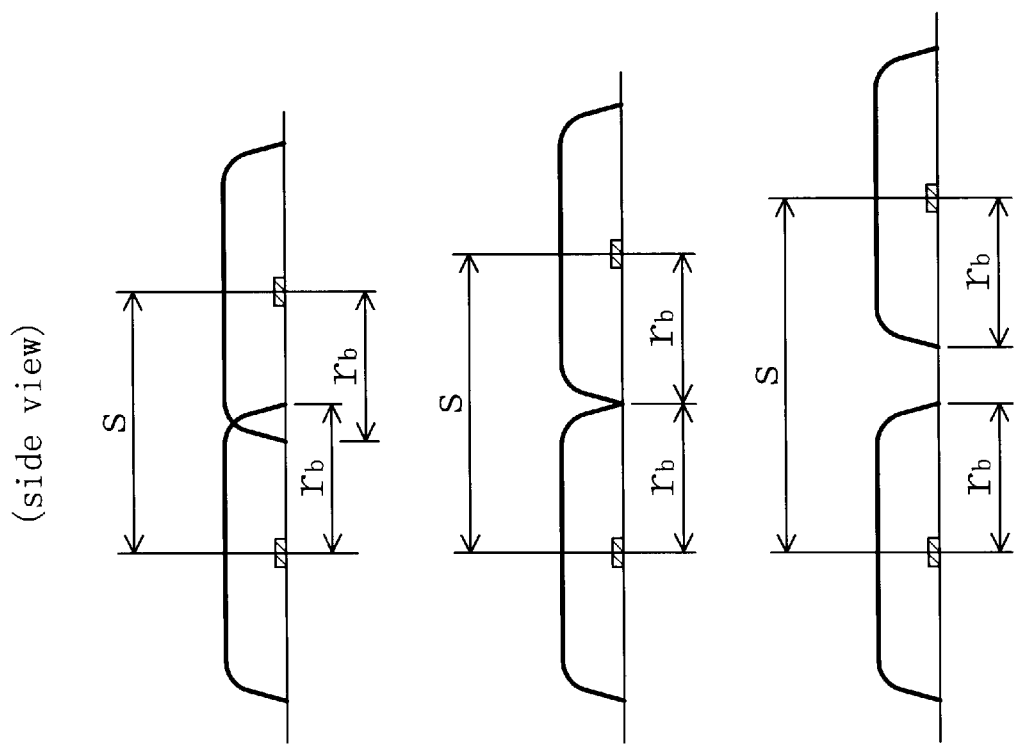
FIGS. 7($a$), 7($b$) and 7($c$) illustrate how the boundary of a backscattered electron's reach moves in a resist film with a change in line-to-line distance.

Next, using a line-and-space pattern shown in FIG. 6, for example, the testing resist film with the same composition and thickness as the resist film is irradiated with the electron beam.

Specifically, as shown in FIG. 6, a number n of regions $A_1$ through $A_n$, each having the same line-and-space pattern, are arranged vertically. A line-to-line distance s gradually increases rightward in such a manner as $s=2\beta_b$, $2(\beta_b+\Delta\beta_b), \ldots$, and the last (right end) line-to-line distance s is set larger than twice the length of the radius $r_b$. All the lines L within the same region are irradiated with the electron beam at the same exposure dose, and the exposure doses are different from each other among these regions. That is to say, the exposure doses of the regions $A_1, A_2, \ldots, A_n$ are defined at $D_1, D_{21}, \ldots, D_n$, respectively. These exposure doses are defined to gradually increase on the descending order in accordance with an equation such as $D_n=D_0 e^{n\Delta D}$, $D_n=\alpha^n D_0$ or $D_n=D_0+n\Delta D$.

Next, if a negative resist is used as the testing resist film, a first exposure dose $D_f$ and a function $D(s)$ of a second exposure dose using the line-to-line distance s as a variable are derived. The first exposure dose $D_f$ is a minimum exposure dose at which one of the lines L of the testing resist film starts to leave the center thereof when the testing resist film is developed. The second exposure dose is a minimum exposure dose, at which one of the spaces S of the testing resist film starts to leave the center thereof.

Alternatively, if a positive resist is used as the testing resist film, a first exposure dose $D_f$ and a function $D(s)$ of a second exposure dose using the line-to-line distance s as a variable are also derived. In this case, the first exposure dose $D_f$ is a minimum exposure dose at which one of the lines L of the testing resist film starts to disappear at the center thereof when the testing resist film is developed. The second exposure dose is a minimum exposure dose, at which one of the spaces S of the testing resist film starts to disappear at the center thereof.

Figure 1:
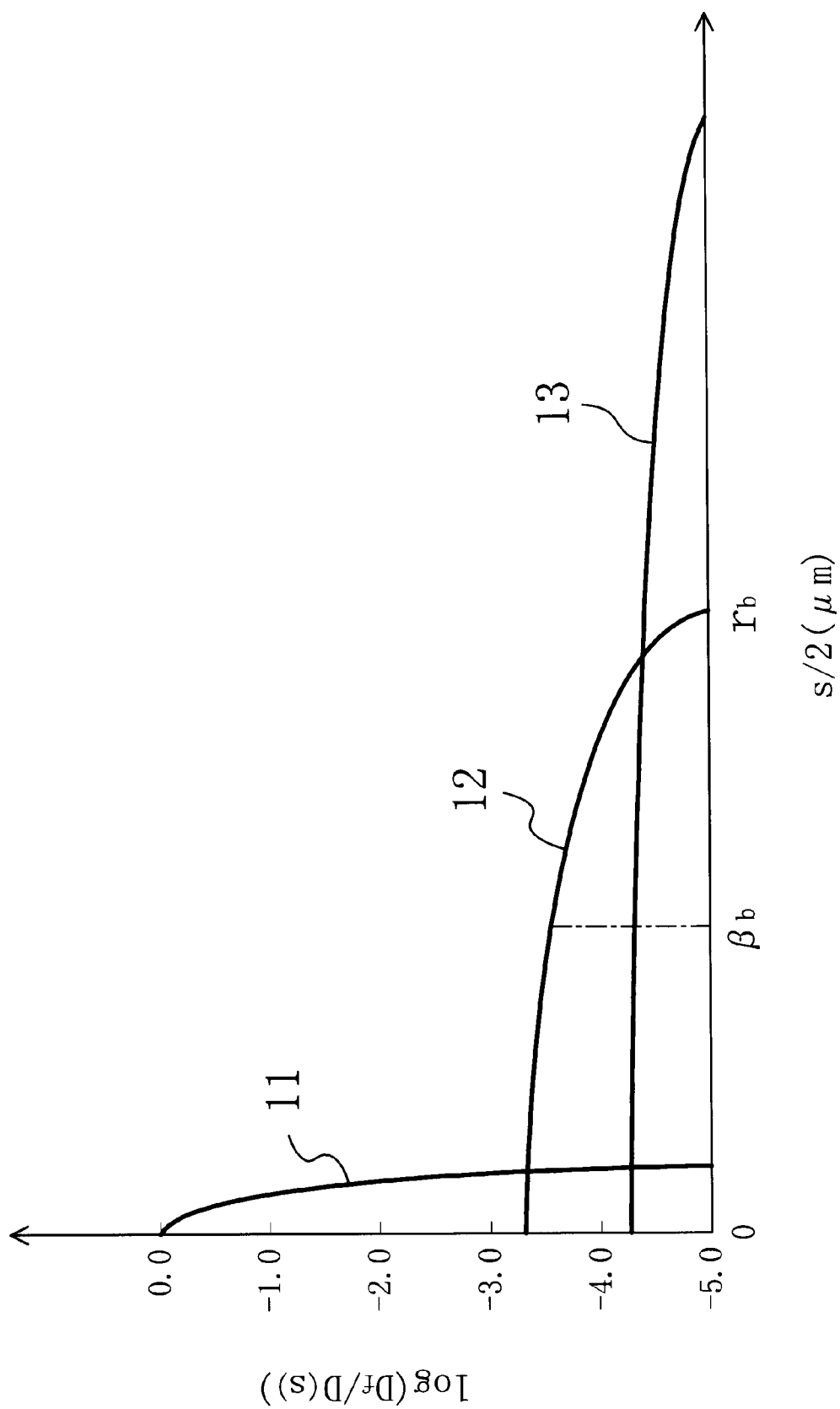
FIG. 1 is a graph illustrating respective exposure intensity distributions obtained by exposing a testing resist film to an electron beam in accordance with a pattern forming method utilizing electron-beam lithography in a first embodiment of the present invention.

Subsequently, by plotting an exposure intensity $\log(D_f/D(s))$ on the axis of ordinates and a distance $s/2$ from the center of the focused electron beam on the axis of abscissas as shown in FIG. 1, the exposure intensity distribution of the electron beam is obtained.

In FIG. 1, first, second and third exposure intensity distributions 11, 12 and 13 are formed by forward-scattered electron, backscattered electron and third exposure source, respectively.

The first and second exposure intensity distributions 11 and 12, where the distance $s/2$ from the center of the electron beam focused is in the range from 0 to $\beta_b$, can be obtained by normalizing the first and second intensity distributions of energy deposited by the forward- and backward-scattered electrons such that the maximum values thereof become zero (=log1).

Figure 2:
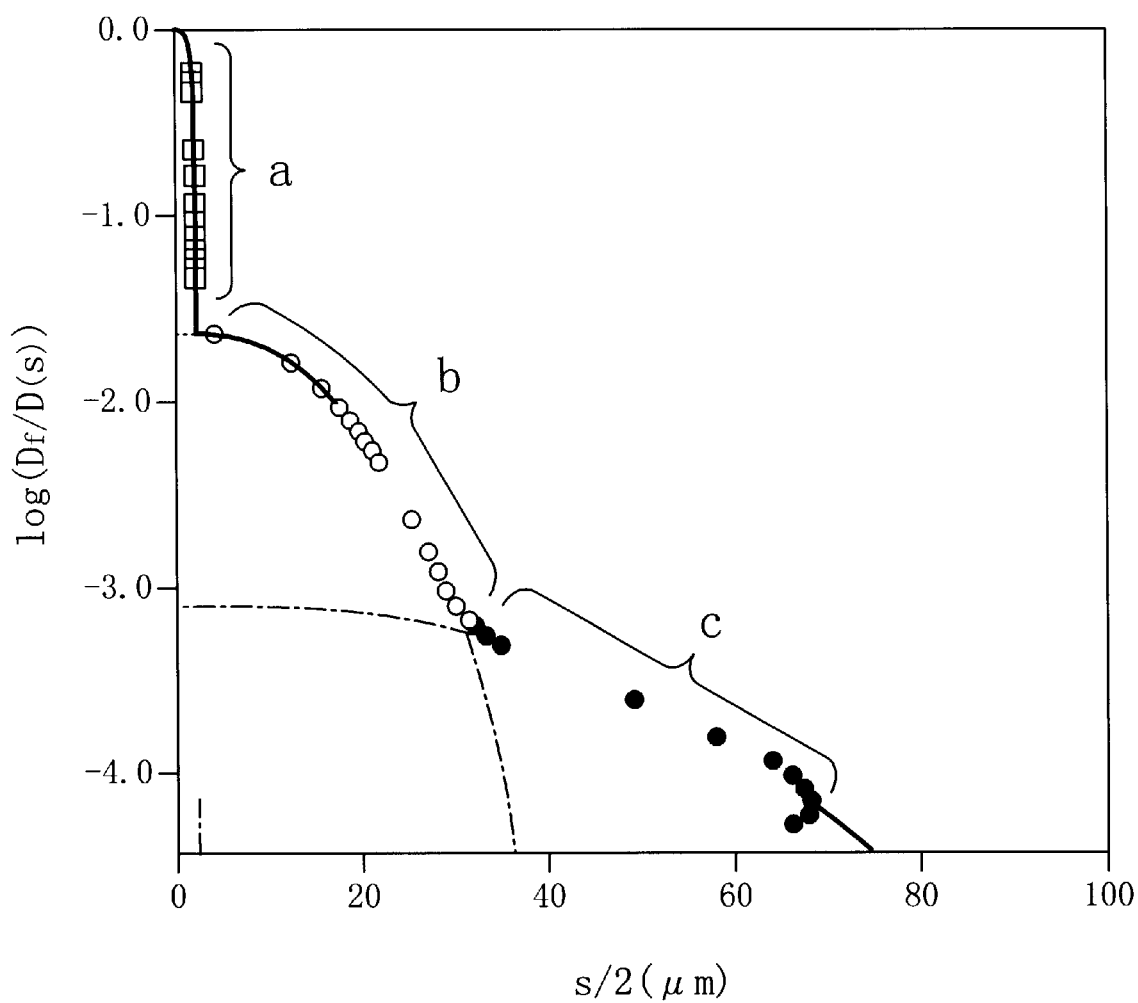
FIG. 2 is a graph illustrating exposure intensity distributions obtained by exposing a testing resist film to an electron beam at an accelerating voltage of 70 keV.

FIG. 2 illustrates exposure intensity distributions obtained by exposing a testing resist film, which is formed on a silicon substrate, to an electron beam at an accelerating voltage of 70 keV. The resist film was formed to be about 0.5 $\mu$m thick on the silicon substrate by applying a negative electron beam resist NEB-22 (name of a product manufactured by Sumitomo Chemical Co., Ltd.) with a threshold sensitivity of about 5 $\mu$C/cm$^2$ onto the silicon substrate.

In FIG. 2, first, second and third exposure intensity distributions a, b and c are formed by forward-scattered electron, backscattered electron and third exposure source, respectively.

Next, a third intensity distribution of energy deposited in the resist film by the third exposure source around the center of the electron beam focused is calculated as $(D_f/D(s))\times E_f$.

In this embodiment, the third intensity distribution is obtained for a region where the distance s/2 from the center of the electron beam focused is longer than the maximum radius $r_b$, i.e., a region of the resist film that is out of back-scattered electron's reach. And the results are used for the proximity effect correction described below.

Specifically, the first, second and third intensity distributions of deposited energy obtained beforehand are approximated to respective Gaussian distributions. Subsequently, a function representing a sum of the first, second and third intensity distributions approximated and a function representing a predetermined exposure dose at an arbitrary position in the resist film (i.e., a function representing an exposure pattern) are convoluted. In this manner, total energy deposited at that arbitrary position in the resist film, on which the pattern should be formed, is calculated. Then, the function representing the exposure pattern is modified so as to equalize the total energy deposited with a predetermined value. As a result, the predetermined exposure dose at an arbitrary position in the resist film, on which a pattern should be formed, can be corrected.

Thereafter, the resist film, on which the pattern should be actually formed, is deposited by a known technique on a film to be processed on the substrate. Then, after the exposure dose of the electron beam has been controlled through the inventive proximity effect correction, the resist film is irradiated with the electron beam at the controlled dose, thereby writing a desired pattern on the resist film. Finally, the resist film, which has been irradiated with the electron beam, is developed by a conventional technique, thereby selectively removing unnecessary portions of the resist film and defining a resist pattern.

In the first embodiment, the proximity effects are corrected by using not only the first and second intensity distributions of energy deposited by the forward- and backward-scattered electrons, but also the third intensity distribution, which is particularly affected by the proximity effects when a highly sensitive resist film is irradiated with an electron beam at a high accelerating voltage. Thus, even when a highly sensitive resist film is irradiated with an electron beam at a high accelerating voltage, the accuracy of proximity effect correction and the resultant pattern accuracy can be both improved.

Also, in the first embodiment, the third intensity distribution can be derived accurately by exposing a testing resist film with the same composition and thickness as a resist film on which a pattern is actually formed. Accordingly, the accuracy of proximity effect correction can be further improved.

Moreover, in the first embodiment, if a resist film with a sensitivity of $20\,\mu C/cm^2$ or less is irradiated with an electron beam at an accelerating voltage of 50 keV or more, the resultant pattern accuracy can be remarkably improved as compared with the conventional pattern forming method utilizing electron-beam lithography.

In the first embodiment, the proximity effect correction may be carried out by using not only the first, second and third intensity distributions formed by the forward-scattered electron, backscattered electron and third exposure source, respectively, but also a fourth intensity distribution of energy deposited in the resist film out of energy of a secondary electron caused in the resist film and the substrate by the irradiation of the electron beam. The fourth intensity distribution is also defined around the center of the electron beam focused.

EMBODIMENT 2

Next, a method for forming a pattern by electron-beam lithography according to a second exemplary embodiment of the present invention will be described with reference to the accompanying drawings. In the second embodiment, an X-ray, which is created in the substrate because an electron enters the substrate upon the irradiation of the electron beam, is regarded as a third exposure source. In addition, an intensity distribution of energy deposited by the X-ray in a region of the resist film, which is out of backscattered electron's reach, is obtained by numerical computations around the center of the electron beam focused. And the results are utilized for proximity effect correction.

Figure 3:
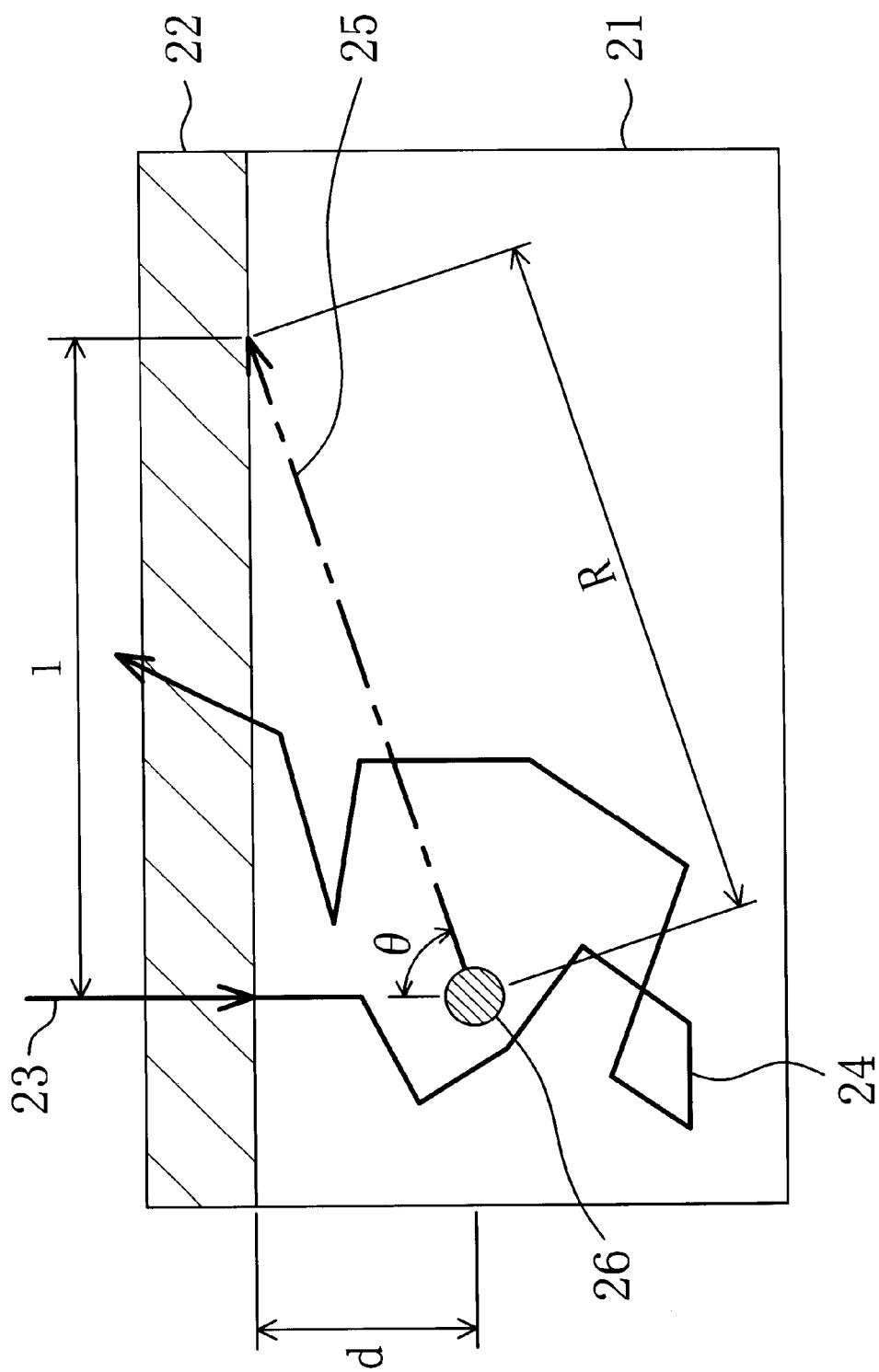
FIG. 3 is a schematic illustrating an exemplary trajectory of an electron, which passes through a resist film, enters a substrate and then scatters, and an exemplary path of an X-ray created in the substrate.

FIG. 3 schematically illustrates an exemplary trajectory 24 of an electron 23, which passes through a resist film 22, enters a substrate 21 and then scatters, and an exemplary path 25 of an X-ray created around a center 26 in the substrate 21.

In FIG. 3, first, second and third distances are identified by the reference signs l, R and d, respectively. The first distance l is defined between the point where the electron 23 enters the substrate 21 and the point where the X-ray reaches the resist film 22. The second distance R is defined between the center 26 where the X-ray is created and the point where the X-ray reaches the resist film 22. And the third distance d is defined between the surface of the substrate 21 and the center 26 where the X-ray is created. The radiation angle of the X-ray is represented by $\theta$ in FIG. 3.

First, by a known Monte Carlo simulation or the like, the forward-scattering radius $\beta_f$, backscattering radius $\beta_b$, and maximum radius $r_b$ of backscattered electron's reach are obtained. And first and second intensity distributions of energy deposited in the resist film 22 by the forward- and backward-scattered electrons, respectively, around the center of the electron beam focused are obtained.

Next, based on the trajectory 24 of the scattering electron obtained by the Monte Carlo simulation or the like, an average depth of the scattering electron is calculated. In this case, the scattering of the electron in the substrate 21 causes an X-ray. Thus, the third distance d, representing the depth of the center 26 of the X-ray, is equal to an average depth of the scattering electron. A relationship $R^2=l^2+d^2$ is met among the first, second and third distances l, R and d.

Then, an intensity distribution $I(\lambda, \theta)$ of an X-ray, which is created per unit current in the substrate by exposing a target, having the same composition and thickness as the substrate 21, to the electron beam at the same accelerating voltage as that applied to the electron 23, is obtained based on the results of experiments or a theoretical equation (see Ludwig Reimer, Scanning Electron Microscopy, SprigerVerlag, pp. 158–169). The intensity distribution $I(\lambda, \theta)$ is a function using the wavelength $\lambda$ and radiation angle $\theta$ of the X-ray as variables. A relationship $\tan\theta=l/d$ is met among the radiation angle $\theta$, first distance l and third distance d.

Subsequently, the number n of electrons contained in the electron beam per unit current is obtained per unit time based on an equation: n=1/elementary charge, and then the intensity distribution of X-ray created per electron in the electron beam is calculated as $I(\lambda, \theta)/n$. In this case, a region just under a point at which the incoming electron 23 enters the substrate 21, where a profusion of X-ray is created, would be a lot smaller than the region that the X-ray reaches. Accordingly, the source of the X-ray can be regarded as a point source. Thus, it is considered that the point source of the X-ray with an intensity $I(\lambda, \theta)/n$ is located just under the point at which the electron 23 enters the substrate 21 and at a depth equal to the third distance d as measured from the surface of the substrate 21, i.e., the center 26 of the X-ray.

Thereafter, the intensity (per electron) of the X-ray with the wavelength $\lambda$ is obtained at a point in time when the X-ray reaches the resist film 22 after having traveled from the center 26 over the second distance R as $\exp(-R/a(\lambda))\times I(\lambda,\theta)/n\times\Delta\lambda$, where $a(\lambda)$ is a transmittance of the X-ray with respect to the substrate 21. Then, the exposure intensity, at which the resist film 22 is exposed to the X-ray with the wavelength $\lambda$, is obtained as $g(\lambda)\times\exp(-R/a(\lambda))\times I(\lambda,\theta)/n\times\Delta\lambda$, where $g(\lambda)$ is a ratio of energy deposited in the resist film by the X-ray with a unit intensity. And this intensity is integrated with respect to the wavelength $\lambda$ of the X-ray, thereby deriving the third intensity distribution of energy deposited by the X-ray in the resist film 22 around the center of the focused electron beam as $\Sigma\{g(\lambda)\times\exp(-R/a(\lambda))\times I(\lambda,\theta)/n\times\Delta\lambda\}$. It should be noted that the transmittance $a(\lambda)$ and energy ratio $g(\lambda)$ may be known values.

In this embodiment, the third intensity distribution is obtained for a region where the first distance l exceeds the maximum radius $r_b$, i.e., a region of the resist film that is outside of the backscattered electron's reach. And the results are used for the proximity effect correction described below.

Specifically, the first and second intensity distributions obtained beforehand are approximated to respective Gaussian distributions. Subsequently, a function representing a sum of the first and second intensity distributions approximated and the third intensity distribution, and a function representing a predetermined exposure dose at an arbitrary position in the resist film (i.e., a function representing an exposure pattern) are convoluted. In this manner, total energy deposited at that arbitrary position in the resist film, on which the pattern should be formed, is calculated. Then, the function representing the exposure pattern is modified so as to equalize the total energy deposited with a predetermined value. As a result, the predetermined exposure dose at an arbitrary position in the resist film, on which a pattern should be formed, can be corrected.

Thereafter, a resist film, on which the pattern should be actually formed, is deposited by a known technique on a film to be processed on the substrate. Then, after the exposure dose of the electron beam has been controlled through the inventive proximity effect correction technique, the resist film is irradiated with the electron beam at the controlled dose, thereby writing a desired pattern on the resist film. Finally, the resist film, which has been irradiated with the electron beam, is developed by a conventional technique, thereby selectively removing unnecessary portions of the resist film and defining a resist pattern.

In the second embodiment, the proximity effects are corrected by using not only the first and second intensity distributions formed by the forward- and backward-scattered electrons, but also the third intensity distribution formed by the X-ray, which is particularly affected by the proximity effects when a highly sensitive resist film is irradiated with an electron beam at a high accelerating voltage. Thus, even when a highly sensitive resist film is irradiated with an electron beam at a high accelerating voltage, the accuracy of proximity effect correction and the resultant pattern accuracy can be both improved.

Also, in the second embodiment, the third intensity distribution can be derived by numerical computations without actually exposing a testing resist film to an electron beam. Accordingly, the proximity effects can be corrected easily.

In the second embodiment, the proximity effects may be corrected by using not only the first, second and third intensity distributions formed by the forward-scattered electron, backscattered electron and X-ray, respectively, but also a fourth intensity distribution of energy deposited in the resist film out of energy of a secondary electron caused in the resist film and the substrate by the irradiation of the electron beam. The fourth intensity distribution is also defined round the center of the electron beam focused.

EMBODIMENT 3

Next, a method for forming a pattern by electron-beam lithography according to a third exemplary embodiment of the present invention will be described with reference to the accompanying drawings. In the third embodiment, a testing resist film with the same composition and thickness as a resist film, on which a pattern is actually formed, is irradiated with an electron beam, thereby obtaining a region of the testing resist film exposed to the third exposure source. And the results are utilized for forming a pattern with an alignment mark.

Figure 4:
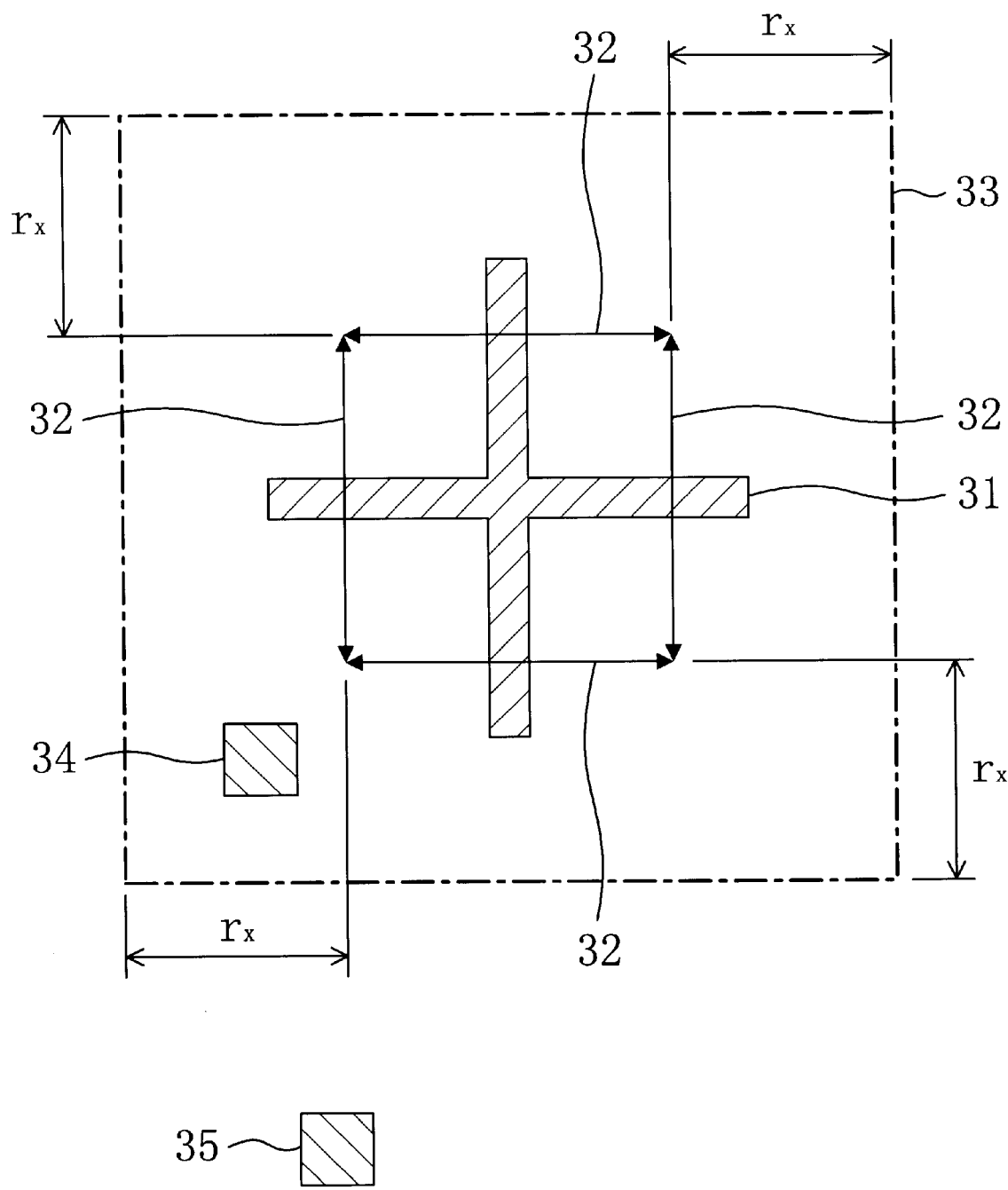
FIG. 4 illustrates an alignment mark used in a pattern forming method utilizing electron-beam lithography in a third embodiment of the present invention.
Figure 5A:
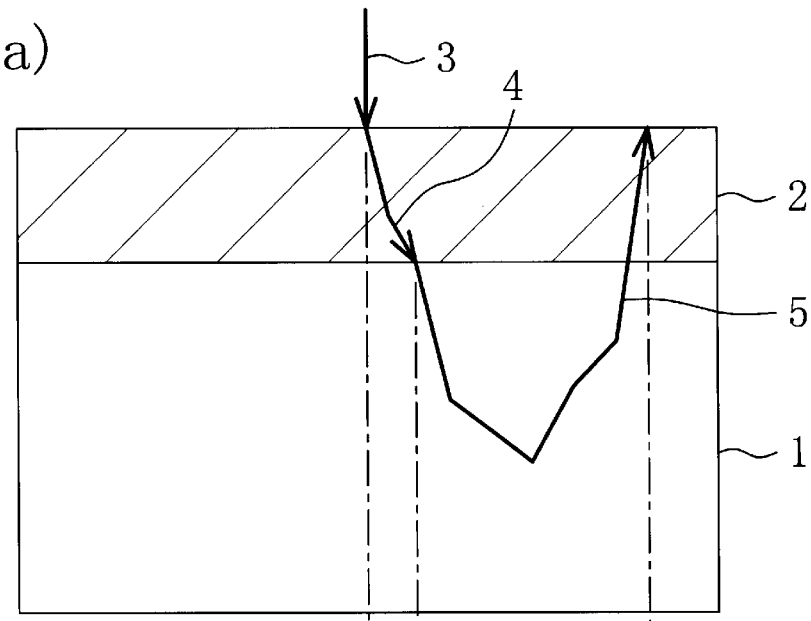
FIG. 5($a$) is a schematic illustrating an exemplary trajectory of an electron, which scatters forward in a resist film and then scatters backward in a substrate.
Figure 5B:
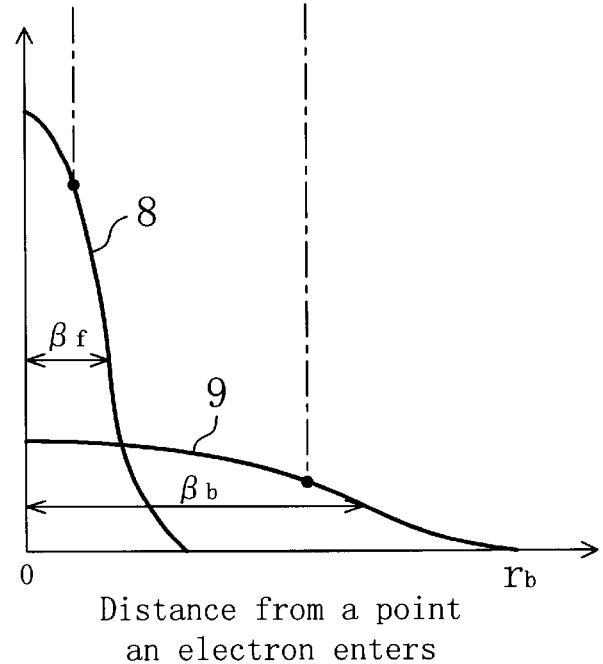

FIG. 4 illustrates an alignment mark used for a method for forming a pattern by electron-beam lithography according to the third embodiment. In FIG. 4, the alignment mark formed on a substrate and surrounding regions thereof are illustrated as viewed from above the substrate. Although not shown in FIG. 4, a resist film, as well as the alignment mark, is formed on the substrate.

As shown in FIG. 4, an alignment mark 31 is scanned by an electron beam along lines 32, thereby exposing a target region 33 of the resist film to the third exposure source. As a result of the exposure of the target region 33 to the third exposure source, a pattern 34 is written inside the target region 33. In addition, a pattern 35 is also written outside of the target region 33. In FIG. 4, $r_x$ indicates a maximum exposure radius. The alignment mark 31 may be either a stepped portion formed by etching the substrate or a convex mark formed out of a material with a larger atomic number than that of silicon (e.g., tungsten) on a silicon substrate, for example.

First, by a known Monte Carlo simulation, for example, the backscattering radius $\beta_b$ and maximum radius $r_b$ of back-scattered electron's reach are derived.

Next, using a line-and-space pattern shown in FIG. 6, for example, the testing resist film with the same composition and thickness as the resist film, on which the pattern is actually formed, is irradiated with the electron beam.

Specifically, as shown in FIG. 6, a number n of regions $A_1$ through $A_n$, each having the same line-and-space pattern, are arranged vertically. A line-to-line distance s gradually increases rightward in such a manner as $s=2\beta_b$, $2(\beta_b+\Delta\beta_b), \ldots$, and the last (right end) line-to-line distance s is set larger than twice the length of the radius $r_b$. All the lines L within the same region are irradiated with an electron beam at the same exposure dose, and the exposure doses are different from each other among these regions. That is to say, the exposure doses of the regions $A_1, A_2, \ldots, A_n$ are defined at $D_1, D_2, \ldots, D_n$ respectively. These exposure doses are defined to gradually increase on the descending order in accordance with an equation such as $D_n=D_0 e^{n\Delta D}$, $D_n=\alpha^n D_0$ or $D_n=D_0+n\Delta D$.

Next, if a negative resist is used as the testing resist film, a maximum line-to-line distance s, at which one of the spaces S of the testing resist film starts to leave the center thereof when the testing resist film is developed, is obtained.

Alternatively, if a positive resist is used as the testing resist film, a maximum line-to-line distance s, at which one of the spaces S of the testing resist film starts to disappear at the center thereof when the testing resist film is developed, is obtained.

Subsequently, the maximum line-to-line distance s measured is divided by two to obtain the maximum exposure radius $r_x$.

When the testing resist film formed on a silicon substrate was irradiated with an electron beam at an accelerating voltage of 70 keV, the maximum exposure radius $r_x$ measured about 70 µm. The testing resist film was formed to be about 0.5 µm thick on the silicon substrate by applying a negative electron beam resist NEB-22 (name of a product manufactured by Sumitomo Chemical Co., Ltd.) with a threshold sensitivity of about 5 µC/CM² onto the silicon substrate.

Thereafter, a resist film, on which the pattern should be actually formed, is deposited by a known technique on a film to be processed on the substrate. Then, the alignment mark formed on the substrate is detected by scanning the electron beam in accordance with a known technique. Thereafter, the resist film is irradiated with the electron beam, thereby writing a pattern thereon.

In this case, the pattern is written only in a region of the resist film outside of its region exposed to the electron beam during the electron beam scanning to detect the alignment mark.

Specifically, as shown in FIG. 4, the pattern is written only in the region distant from the electron beam scanning lines 32 for detecting the alignment mark 31 by more than the maximum exposure radius $r_x$, i.e., outside of the target region 33 exposed to the third exposure source during the electron beam scanning.

Finally, the resist film, which has been irradiated with the electron beam, is developed by a conventional technique, thereby selectively removing unnecessary portions of the resist film and defining a resist pattern.

In the third embodiment, the pattern is written only in a region of the resist film outside of the target region. Accordingly, it is possible to prevent the pattern accuracy from being degraded by the electron beam scanning for detecting the alignment mark.

Although the pattern is written only in the region of the resist film outside of its target region, the pattern may be written within the target region if necessary by the following method.

For example, if the pattern 34 should be written inside the target region 33 as shown in FIG. 4, the exposure dose should be smaller than that defined for writing the pattern 35 in the region outside of the target region 33 by a quantity equivalent to the energy deposited in the target region 33 during the electron beam scanning for detecting the alignment mark 31. Then, the total energy deposited by the electron beam in the target region 33 can be approximately equalized with the total energy deposited by the electron beam in the region outside of the target region 33. Thus, the accuracy of the pattern 34 written inside the target region 33 can be substantially equalized with that of the pattern 35 written outside of the target region 33.

What is claimed is:

1. A method for forming a pattern, comprising the steps of:
   depositing a resist film on a film to be processed on a substrate;
   irradiating the resist film with an electron beam at an exposure dose controlled by proximity effect correction, thereby writing a pattern onto the resist film; and
   developing the resist film, which has been irradiated with the electron beam, thereby defining a resist pattern,
   wherein the proximity effect correction is carried out by using:
   a first intensity distribution of energy deposited in the resist film out of energy of a forward-scattered electron caused in the resist film by the irradiation of the electron beam;
   a second intensity distribution of energy deposited in the resist film out of energy of a backscattered electron caused in the substrate by the irradiation of the electron beam; and
   a third intensity distribution of energy created by the irradiation of the electron beam and deposited in a region of the resist film, which is outside of a backscattered electron's reach,
   the first, second and third intensity distributions being all defined around the center of the electron beam focused.

2. The method of claim 1, wherein the resist film is a negative resist, and
   wherein the third intensity distribution is given by $(D_f/D(s)) \times E_f$,
   wherein $E_f$ is forward-scatter energy, which is deposited at the center of the electron beam focused on the resist film out of the energy of the forward-scattered electron caused in the resist film by the irradiation of the electron beam, and
   wherein $D_f$ is a first exposure dose, which is a minimum exposure dose at which one of a plurality of lines of a testing resist film starts to leave the center thereof when the testing resist film is developed after the lines have been irradiated with the electron beam with the exposure dose thereof varied,
   the testing resist film and the resist film having the same composition and thickness, and
   a line-to-line distance between adjacent ones of the lines gradually increasing from a value equal to or smaller than twice the length of a backscattering radius to a value more than twice the length of a maximum radius of backscattered electron's reach, the backscattering radius being a standard deviation of a Gaussian distribution representing a lateral range of the backscattered electron in the resist film, the maximum radius representing a limit of the lateral range of the backscattered electron, and
   wherein D(s) is a function representing a second exposure dose using the line-to-line distance as a variable, the second exposure dose being a minimum exposure dose, at which one of a plurality of spaces between the lines of the testing resist film starts to leave the center thereof.

3. The method of claim 1, wherein the resist film is a positive resist, and
   wherein the third intensity distribution is given by $(D_f/D(s)) \times E_f$,
   wherein $E_f$ is forward-scatter energy, which is deposited at the center of the electron beam focused on the resist film out of the energy of the forward-scattered electron caused in the resist film by the irradiation of the electron beam, and
   wherein $D_f$ is a first exposure dose, which is a minimum exposure dose at which one of a plurality of lines of a testing resist film starts to disappear at the center thereof when the testing resist film is developed after the lines have been irradiated with the electron beam with the exposure dose thereof varied,
   the testing resist film and the resist film having the same composition and thickness,
   a line-to-line distance between adjacent ones of the lines gradually increasing from a value equal to or smaller than twice the length of a backscattering radius to a value more than twice the length of a maximum radius of backscattered electron's reach, the backscattering radius being a standard deviation of a Gaussian distribution representing a lateral range of the backscattered electron in the resist film, the maximum radius representing a limit of the lateral range of the backscattered electron, and wherein D(s) is a function representing a second exposure dose using the line-to-line distance as a variable, the second exposure dose being a minimum exposure dose, at which one of a plurality of spaces between the lines of the testing resist film starts to disappear at the center thereof.

4. The method of claim 1, wherein the proximity effect correction is carried out by using not only the first, second and third intensity distributions, but also a fourth intensity distribution of energy deposited in the resist film out of energy of a secondary electron caused in the resist film and the substrate by the irradiation of the electron beam, the fourth intensity distribution being also defined around the center of the electron beam focused.

5. A method for forming a pattern, comprising the steps of:

depositing a resist film on a film to be processed on a substrate;

irradiating the resist film with an electron beam at an exposure dose controlled by proximity effect correction, thereby writing a pattern onto the resist film; and developing the resist film, which has been irradiated with the electron beam, thereby defining a resist pattern, wherein the proximity effect correction is carried out by using:

a first intensity distribution of energy deposited in the resist film out of energy of a forward-scattered electron caused in the resist film by the irradiation of the electron beam;

a second intensity distribution of energy deposited in the resist film out of energy of a backscattered electron caused in the substrate by the irradiation of the electron beam; and a third intensity distribution of energy deposited in a region of the resist film, which is outside of a backscattered electron's reach, out of energy of an X-ray created in the substrate by the irradiation of the electron beam, the first, second and third intensity distributions being all defined around the center of the electron beam focused.

6. The method of claim 5, wherein the third intensity distribution is given by $$\Sigma\{g(\lambda) \times \exp(-R/a(\lambda)) \times I(\lambda,\theta)/n \times \Delta\lambda\}$$

where $I(\lambda, \theta)$ is a function representing the intensity of the X-ray, which has been created in the substrate by the irradiation of the electron beam per unit current, using the wavelength and radiation angle of the X-ray as variables;

n is the number of electrons contained in the electron beam per unit current, the number being measured as a reciprocal of elementary charge per unit time;

$a(\lambda)$ is a function representing the transmittance of the X-ray with respect to the substrate using the wavelength of the X-ray as a variable;

$g(\lambda)$ is a function representing a ratio of energy deposited in the resist film by the X-ray with a unit intensity using the wavelength of the x-ray as a variable; and R is a distance from a point where the X-ray is created to a point where the X-ray reaches the resist film.

7. The method of claim 5, wherein the proximity effect correction is carried out by using not only the first, second and third intensity distributions, but also a fourth intensity distribution of energy deposited in the resist film out of energy of a secondary electron caused in the resist film and the substrate by the irradiation of the electron beam, the fourth intensity distribution being also defined around the center of the electron beam focused.

8. A method for forming a pattern, comprising the steps of:

a) depositing a resist film on a film to be processed on a substrate;

b) detecting an alignment mark formed on the substrate by scanning an electron beam;

c) irradiating the resist film with the electron beam, thereby writing a pattern onto the resist film; and d) developing the resist film, which has been irradiated with the electron beam, thereby defining a resist pattern, wherein the step c) includes writing the pattern only in a region of the resist film outside of a target region which is outside of the backscattered electron's reach thereof exposed to the electron beam while the electron beam is being scanned in the step b).

9. The method of claim 8, wherein the resist film is a negative resist, and wherein in the target region, a distance from a position at which the electron beam is scanned in the step b) is within a maximum exposure radius, the maximum exposure radius being one half of a maximum line-to-line distance, at which one of a plurality of spaces between lines of a testing resist film starts to leave the center thereof when the testing resist film is developed after the lines have been irradiated with the electron beam with the exposure dose thereof varied, and wherein the line-to-line distance between adjacent ones of the lines gradually increases from a value equal to or smaller than twice the length of a backscattering radius to a value more than twice the length of a maximum radius of backscattered electron's reach, the backscattering radius being a standard deviation of a Gaussian distribution representing a lateral range of the backscattered electron in the resist film, the maximum radius of backscattered electron's reach representing a limit of the lateral range of the backscattered electron, the testing resist film and the resist film having the same composition and thickness.

10. The method of claim 8, wherein the resist film is a positive resist, and wherein in the target region, a distance from a position at which the electron beam is scanned in the step b) is within a maximum exposure radius, the maximum exposure radius being one half of a maximum line-to-line distance, at which one of a plurality of spaces between lines of a testing resist film starts to disappear at the center thereof when the testing resist film is developed after the lines have been irradiated with the electron beam with the exposure dose thereof varied, and wherein the line-to-line distance between adjacent ones of the lines gradually increases from a value equal to or smaller than twice the length of a backscattering radius to a value more than twice the length of a maximum radius of backscattered electron's reach, the backscattering radius being a standard deviation of a Gaussian distribution representing a lateral range of the backscattered electron in the resist film, the maximum radius of backscattered electron's reach representing a limit of the lateral range of the backscattered electron, the testing resist film and the resist film having the same composition and thickness.

11. A method for forming a pattern, comprising the steps of:

a) depositing a resist film on a film to be processed on a substrate;

b) detecting an alignment mark formed on the substrate by scanning an electron beam;

c) irradiating the resist film with the electron beam, thereby writing a pattern onto the resist film; and d) developing the resist film, which has been irradiated with the electron beam, thereby defining a resist pattern, wherein the step c) includes setting an exposure dose, at which a target region of the resist film is irradiated with the electron beam, smaller than an exposure dose, at which another region of the resist film outside of the target region which is outside of the backscattered electron's reach is irradiated with the electron beam while the electron beam is being scanned in the step b).

12. The method of claim 11, wherein the resist film is a negative resist, and wherein in the target region, a distance from a position at which the electron beam is scanned in the step b) is within a maximum exposure radius, the maximum exposure radius being one half of a maximum line-to-line distance, at which one of a plurality of spaces between lines of a testing resist film starts to leave the center thereof when the testing resist film is developed after the lines have been irradiated with the electron beam with the exposure dose thereof varied, and wherein the line-to-line distance between adjacent ones of the lines gradually increases from a value equal to or smaller than twice the length of a backscattering radius to a value more than twice the length of a maximum radius of backscattered electron's reach, the backscattering radius being a standard deviation of a Gaussian distribution representing a lateral range of the backscattered electron in the resist film, the maximum radius of backscattered electron's reach representing a limit of the lateral range of the backscattered electron, the testing resist film and the resist film having the same composition and thickness.

13. The method of claim 11, wherein the resist film is a positive resist, and wherein in the target region, a distance from a position at which the electron beam is scanned in the step b) is within a maximum exposure radius, the maximum exposure radius being one half of a maximum line-to-line distance, at which one of a plurality of spaces between lines of a testing resist film starts to disappear at the center thereof when the testing resist film is developed after the lines have been irradiated with the electron beam with the exposure dose thereof varied, and wherein the line-to-line distance between adjacent ones of the lines gradually increases from a value equal to or smaller than twice the length of a backscattering radius to a value more than twice the length of a maximum radius of back scattered electron's reach, the backscattering radius being a standard deviation of a Gaussian distribution representing a lateral range of the backscattered electron in the resist film, the maximum radius of backscattered electron's reach representing a limit of the lateral range of the backscattered electron, the testing resist film and the resist film having the same composition and thickness.

* * * * *